US006946839B2

United States Patent
Porter (10) Patent No.: US 6,946,839 B2
(45) Date of Patent: Sep. 20, 2005

(54) MAGNETIC RESONANCE IMAGING METHOD AND APPARATUS WITH SPATIAL CODING USING READOUT SEGMENTATION

(75) Inventor: David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/830,511

(22) Filed: Apr. 23, 2004

(65) Prior Publication Data

US 2004/0257078 A1 Dec. 23, 2004

(30) Foreign Application Priority Data

Apr. 25, 2003 (DE) .......................................... 103 18 990

(51) Int. Cl.[7] ................................................. G01V 3/00
(52) U.S. Cl. ...................................... 324/309; 324/307
(58) Field of Search ................................. 324/309, 307, 324/306, 300, 310, 312; 600/410

(56) References Cited

U.S. PATENT DOCUMENTS

| | | | | |
|---|---|---|---|---|
| 5,270,654 A | * | 12/1993 | Feinberg et al. | ............ 324/309 |
| 5,570,020 A | * | 10/1996 | Bornert | ...................... 324/309 |
| 5,581,181 A | * | 12/1996 | Fuderer | ...................... 324/309 |
| 5,952,827 A | * | 9/1999 | Feinberg | ..................... 324/309 |
| 6,804,546 B1 | * | 10/2004 | Thompson et al. | ......... 600/410 |

OTHER PUBLICATIONS

"Image Acquistion in a Second with Half–Fourier–Acquisition Single–Shot Turbo Spin Echo," Kiefer et al, J. Magn. Reson. Im. vol. 4 (P) (1994), p. 86.
GRASE Improves Spatial Resolution in Single Shot Imaging, Feinberg et al, Magn. Reson. Med., vol. 33 (1995) pp. 529–533.
"RARE Imaging: A Fast Imaging Method for Clinical MR," Hennig et al, Magn. Reson. Med., vol. 3 (1986) pp. 823–833.

* cited by examiner

Primary Examiner—Louis Arana
(74) Attorney, Agent, or Firm—Schiff Hardin LLP (57) ABSTRACT

In a method and apparatus for magnet resonance imaging, and RF excitation pulse is emitted for the excitation of spins in an object to be examined and simultaneously a slice-selection gradient is activated during the RF excitation pulse, a pulse series of refocusing pulses is emitted, a slice-selection gradient pulse is activated during each refocusing pulse, and alternating readout gradient pulse series are activated, each series being in the pulse between two refocusing pulses, with a de-phasing pulse being activated immediately before each readout gradient pulse series and a re-phasing pulse being activated immediately after the each readout gradient pulse series such that a corresponding offset is produced in the readout direction so that each readout gradient pulse series scans a part of the k-matrix in the $k_x$ direction in a serpentine-like manner, with the serpentine-like scanning of each partial section being implemented by activating short phase-coding gradient pulses during each zero point of the corresponding readout-gradient pulse series.

13 Claims, 6 Drawing Sheets

MAGNETIC RESONANCE IMAGING METHOD AND APPARATUS WITH SPATIAL CODING USING READOUT SEGMENTATION

BACKGROUND OF THE INVENTION

1. Field of the Invention

The present invention concerns, in general, the magnetic resonance tomography (MRT) as used in medicine to examine patients. The present invention concerns, in particular, an MRT imaging procedure for the acquisition of high-resolution single-shot images in a short scanning period.

2. Description of the Prior Art

MRT is based on the physical phenomenon of nuclear spin resonance and has been successfully employed in medicine and biophysics as an imaging procedure for more than 15 years. In this modality, the object is exposed to a strong, constant magnetic field. The nuclear spins of the atoms, which were previously randomly oriented, thereby are aligned in the object. Radio-frequency energy can then excite these "ordered" nuclear spins to a specific oscillation. This oscillation creates the actual measurement signal in MRT, which is recorded using suitable receiving coils. By the use of inhomogeneous magnetic fields, generated by gradient coils, the examination subject, and the signals therefrom, be encoded spatially in all three spatial directions, which is in general called "spatial encoding."

The acquisition of the data in MRT takes places in k-space (frequency domain). The MRT image in the image domain is linked with the MRT data in k-space by means of Fourier transformation. The spatial encoding of the object, which spans k-space, takes place by means of gradients in all three spatial directions. A distinction is made between the slice readout gradient (determines an absorption slice in the object, usually along the z-axis), the frequency coding gradient (determines a direction in the slice, normally along the x-axis), and the phase-coding gradient (determines the second dimension within the slice, usually the y-axis).

First, a slice of the subject, e.g. in the z direction is selectively stimulated. The coding of the location information in the slice takes place by a combined phase and frequency coding by means of these two already-mentioned orthogonal gradient fields that in the example of a slice stimulated in the z-direction, are generated by the aforementioned gradient coils in the x and y-directions, respectively.

Figure 2A:
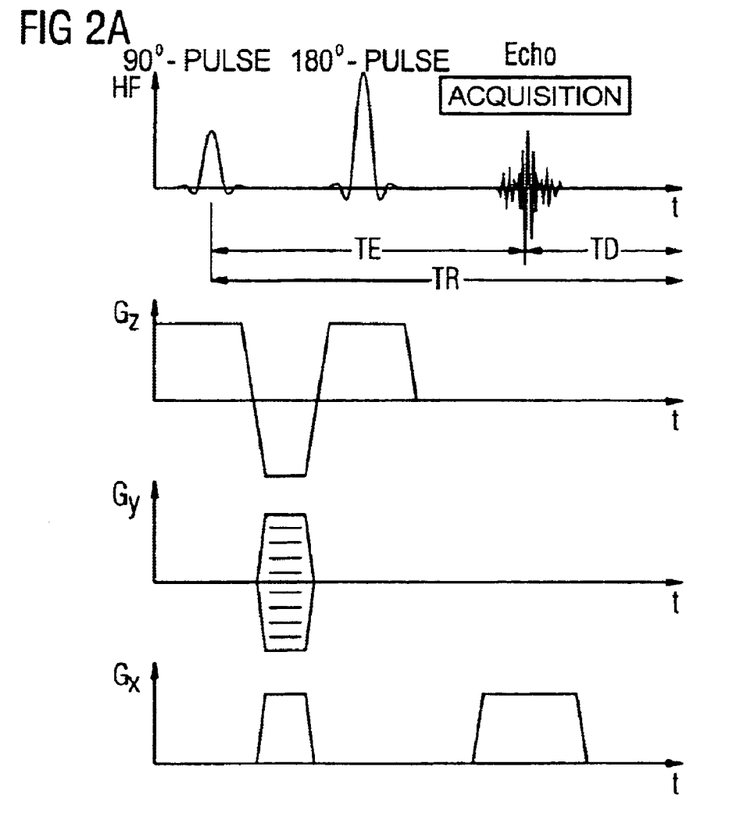
FIG. 2a schematically illustrates the known spin-echo sequence.
Figure 2B:
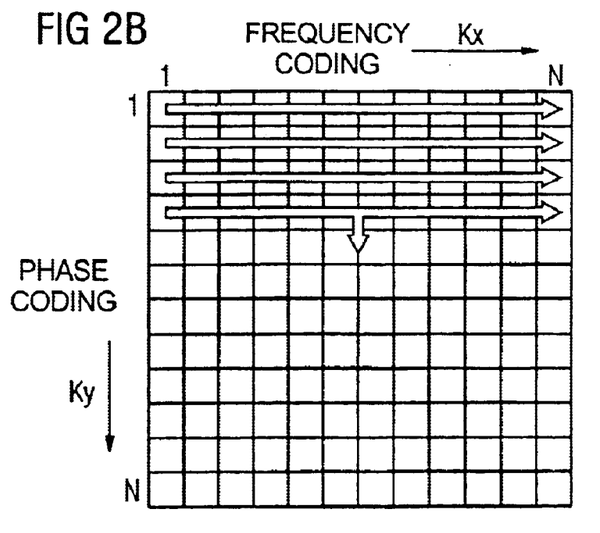

A first possible sequence for recording the data in an MRT scan is shown in FIGS. 2a and 2b. The sequence used is a spin-echo sequence. In this sequence, the magnetization of the spins in the x-y plane is displaced by a 90° excitation pulse, In the course of time (½ $T_E$; $T_E$ is the echo time), this leads to a de-phasing of the magnetization components, which together form the transverse magnetization in the x-y plane $M_{xy}$. After a certain period of time, (e.g. ½ $T_E$) a 180° pulse is emitted such that the de-phased magnetization components are flipped without the precession direction and precession speed of the individual magnetization portions being changed. After such a further time duration ½ $T_E$, the magnetization components point in the same direction again, i.e. a regeneration or "re-phasing" of the transverse magnetization occurs. The complete regeneration of the transverse magnetization is called spin echo.

In order to measure an entire layer of the object to be examined, the imaging sequence is repeated N times for different values of the phase encoding gradient e.g. Gy, with the frequency of the magnetic resonance signal (spin-echo signal) being scanned, digitized, and stored N times in equidistant time intervals Δt in the presence of the readout gradient for each sequence execution using a Δt-clocked ADC (Analog Digital Converter). In this manner, a line-by-line numerical matrix (matrix in k-space or k-matrix) with N×N data points is obtained in accordance with FIG. 3b (a symmetrical matrix with N×N points is only one example, asymmetrical matrices also can be created). An MR image of the slice in question with a resolution of N×N pixels can be reconstructed directly from this data record through a Fourier transformation.

Figure 4A:
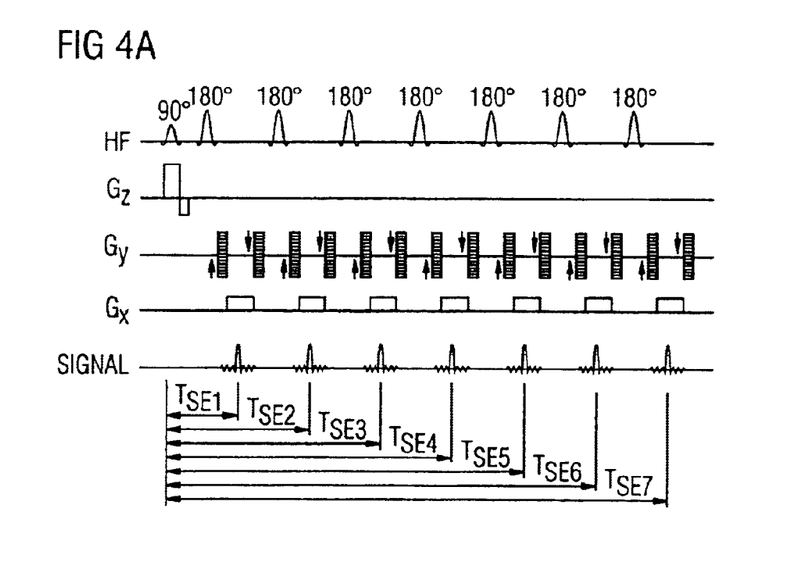
FIG. 4a schematically illustrates the known TSE or RARE sequence in which seven gradient echoes are generated.
Figure 4B:
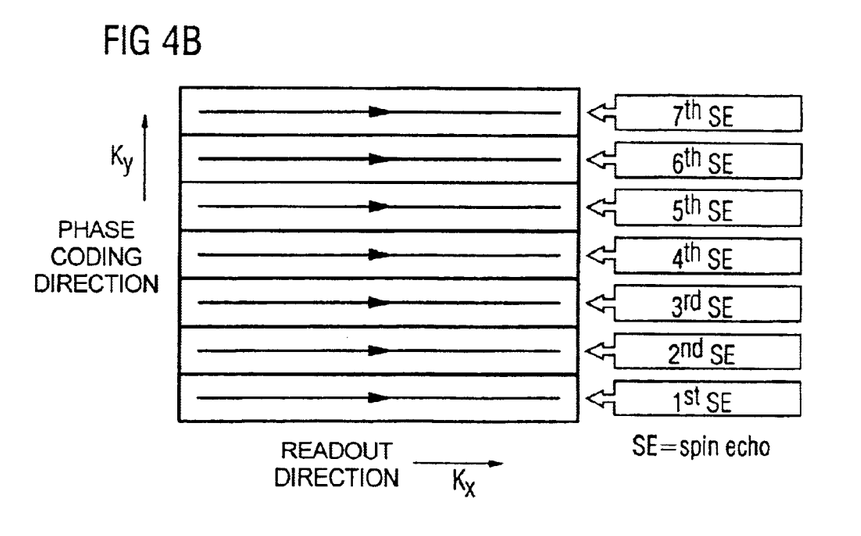

The scanning of the k matrix (or k matrices in the case of data acquisition from several layers) for spin echo sequences with diagnostically usable image quality normally requires several minutes of measurement time, was can be a problem for many clinical application. For example, patients cannot remain immobile for the required period of time. For examinations of the thorax or in the pelvic region movement of the anatomy is generally unavoidable (cardiac and respiratory movements, peristalsis). One way to accelerate the spin echo sequence was published in 1986 as the Turbo Spin Echo sequence (TSE sequence) or under the acronym RARE (Rapid Acquisition with Relaxation Enhancement) (J. Hennig et al. Magn. Reson. Med. 3, 823–833, 1986). In this procedure, that is much faster compared to the conventional aforementioned spin echo procedure, several multiple echoes are created based on a 90° excitation pulse, with each of these echoes being individually phase-encoded. A corresponding sequence diagram is shown in FIG. 4a for the case of seven echoes being generated for each. The phase-coding gradient must be switched before and after the echo according to the selected Fourier line. In this manner, a linear scanning of the k matrix takes place after one single RF excitation pulse (90°) as shown in FIG. 4b. The required total measurement time is shortened in this example by a factor of 7. The signal progression in FIG. 4a is shown in an idealized manner. In reality, the later echoes have increasingly smaller amplitudes due to the dismantling of the transverse magnetization T2.

An even faster imaging sequence is a combination of RARE with the half-Fourier technique that was introduced in 1994 as the so-called HASTE sequence (Half-Fourier Acquired Single-Shot Turbo Spin Echo) (B. Kiefer et al., J.Magn. Reson. Imaging, 4(P), 86, 1994). HASTE uses the same basic technique as RARE, but only half of the k-matrix is scanned. The other half of the k-matrix is reconstructed by calculation manner using a half-Fourier algorithm. For this purpose, use is made of the fact that the data points of the k-matrix are arranged mirror-symmetrical to the mid-point of the k-matrix. Thus, it suffices to only measure the data points of one k-matrix half and to complete the raw data matrix by mirroring with respect to the mid-point (and complex conjugation). In this manner, the measurement time can be reduced by half. The reduction of the recording time, however, is has an associated degradation of the signal to noise ratio (S/R) by a factor of $\sqrt{42}$.

A further method for quickly obtaining and scanning the k-matrix is the "echo-planar imaging" (EPI) procedure. The main idea behind this procedure is to generate a series of echoes in the readout gradient ($G_x$), which are assigned to different lines in the k-matrix through a suitable gradient switch (modulation of the phase encoding gradient Gy), after a single (selective) RF stimulus in a very short period of time. In this manner, all lines of the k-matrix can be acquired with one single sequence execution. Different versions of the method also known as the echo-planar technique differ only as to how the phase-encoding gradients are switched, i.e. how the data points of the k-matrix are scanned.

Figure 3A:
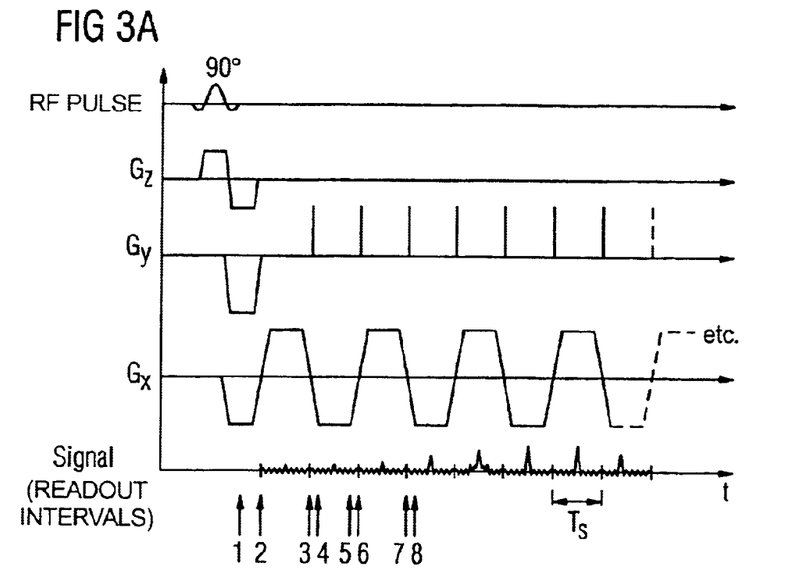
FIG. 3a schematically illustrates the known echo-planar imaging sequence with trapezoidal readout gradients.
Figure 3B:
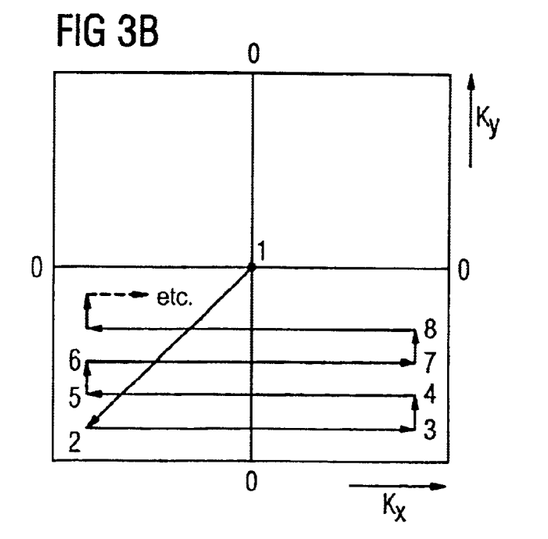

The ideal form of an echo-planar pulse sequence is shown in FIG. 3a. The needle-like Gy pulses in the activation of the readout gradient Gx (so-called "blips") lead to the serpentine-like path of the k-matrix shown in FIG. 3b so that, with chronologically similar scanning, the measurement points come to lie equidistantly in k space.

The scanning of the echo sequence must be completed in a time that corresponds with the dismantling of the transverse magnetization $T_2^*$. Otherwise, the different lines of the k-matrix would namely be weighted according to the sequential order of their acquisition: certain location frequencies would be overemphasized and others underemphasized.

Figure 5A:
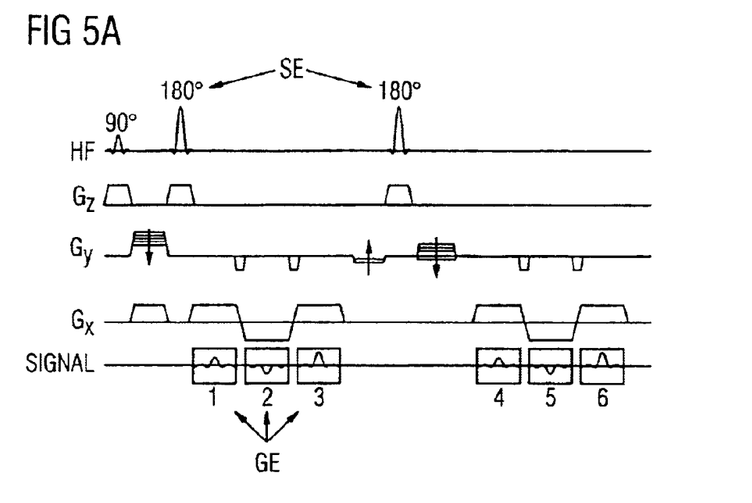
FIG. 5a schematically illustrates the known GRASE sequence in which six acquired gradient echoes are shown.
Figure 5B:
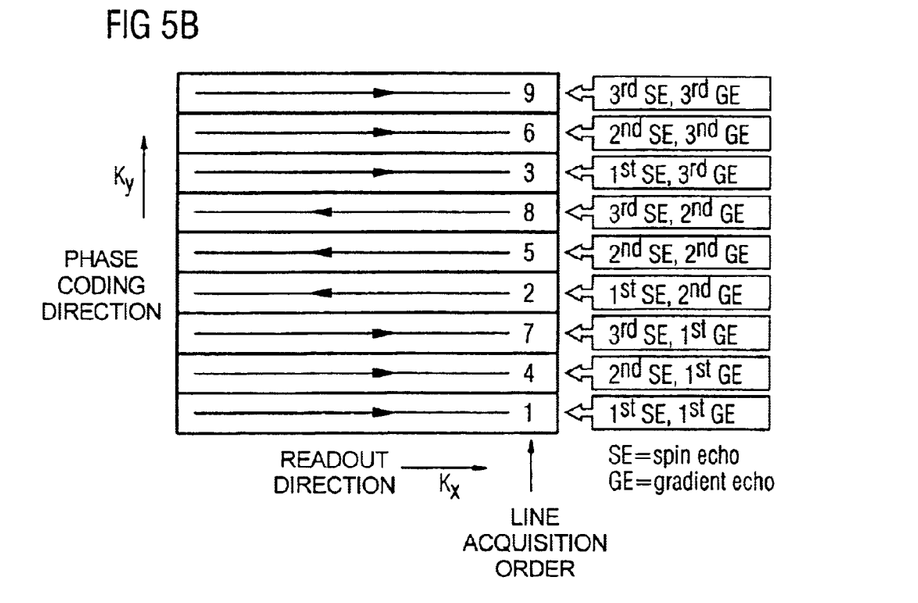

Another quick MRT imaging procedure is GRASE (Gradient and Spin-Echo) GRASE was first introduced in 1995 (D. Feinberg et al. Magnetic Resonance Medicine 33, 529–533, 1995) and can be seen as a hybrid technique of EPI and RARE with the underlying idea of scanning the spin-echo envelope with several gradient echoes. With GRASE, as shown in FIG. 5a, several RF 180° refocusing pulses are applied in order to generate a spin-echo string like with RARE as well as a number of readout gradient pulses in order to create the corresponding gradient pulse string after each respective 180° refocusing pulse. The diagram in FIG. 5b shows the chronological sequence in which the k-space lines are acquired during a GRASE sequence. The diagram shows the simplified case of 3 spin echoes (SE), 3 gradient echoes (GE) and thus a total of 9 phase-encoding steps. The chronological progression of the scanning takes place such that, for each spin echo, the corresponding gradient echoes and the k-matrix as thus filled up component by component. For clarification, the current scanning sequence is given in the right margin of the k-matrix. It is noted that other versions of GRASE that employ a different scanning sequence are also known.

SUMMARY OF THE INVENTION

An object of the present invention is to provide an imaging procedure for magnetic resonance tomography that has improvements over the imaging procedures described above. The improvements include, among other things, a decrease in the susceptibility artifacts and a lower sensitivity with respect to dynamic field changes compared to EPI as well as a less complex signal modulation in k-space compared to GRASE, which then leads to fewer ring and ghost artifacts. Furthermore, a lower specific absorption rate (SAR) is described as well as fewer artifacts with respect to movement-induced phase shifts with diffusion-weighted imaging.

This object is achieved in accordance with the invention in an MRT method and apparatus wherein a radio-frequency excitation pulse is emitted for the excitation of spins in an object to be examined, a slice-selection gradient (GS) is simultaneously activated during the radio-frequency excitation pulse, a pulse series of refocusing pulses is generated, a slice-selection gradient pulse is activated during each refocusing pulse, and a series of alternating readout gradient pulses is activated in each pause between two refocusing pulses, with a de-phasing pulse being activated immediately before each readout gradient pulse series and a re-phasing pulse being activated immediately after each readout gradient pulse series such that a corresponding offset is created in the readout direction so that each readout gradient pulse series scans a part of the k-matrix in the $k_x$ direction in a serpentine-like manner, with the serpentine-like scanning of each partial section being implemented by activation of short phase-coding gradient pulses (GP) during each zero point of the corresponding readout-gradient pulse series.

The radio-frequency excitation pulse is preferably a 90° pulse. Each refocusing pulse is also preferably a 180° pulse, and the refocusing pulses also preferably have the same chronological spacing from one another.

The gradient moment (the chronological time integral over the gradient amplitude) of each readout gradient pulse string is preferably so small that a correspondingly short gradient echo spacing can be selected such that the procedure is insensitive with respect to magnetic field susceptibilities as well as dynamic magnetic field continuities.

Moreover, the procedure according to the invention can be combined with a partial Fourier acquisition technique, with a partial parallel imaging technique (SMASH, SENSE, GRAPPA) and/or with a magnetization preparation using RF pulses and magnetic field gradient pulses (diffusion weighting, fluid suppression).

Furthermore, in a first preferred embodiment of the procedure in accordance with the invention, only a portion of the k-matrix in the $k_x$ and/or $k_y$ direction(s) is scanned after a radio-frequency excitation pulse and the scanning of the entire k-matrix is realized by the progression of several radio-frequency excitation pulses.

In a second preferred embodiment of the procedure in accordance with the invention, the procedure is used in combination with phase coding in the slice selection direction using slice-selective or non-slice-selective excitation pulses for 3D imaging.

The magnetic resonance tomography apparatus according to the invention has gradient amplifiers with respectively associated gradient coils, a display terminal a sequence controller and system processor as well as an analog-to-digital converter (ADC) that is suitable for performing the procedure described above.

DESCRIPTION OF THE DRAWINGS

FIG. 2b illustrates the chronological scanning of the k-matrix for the spin-echo sequence in accordance with FIG. 2a.

FIG. 3b illustrates the chronological scanning of the k-matrix for the echo-planar imaging sequence in accordance with FIG. 3a.

FIG. 4b illustrates the chronological scanning of the k-matrix for a TSE or RARE sequence in accordance with FIG. 4a.

FIG. 5b illustrates the chronological scanning of the k-matrix for the GRASE sequence in accordance with FIG. 5a.

DESCRIPTION OF THE PREFERRED EMBODIMENTS

Figure 1:
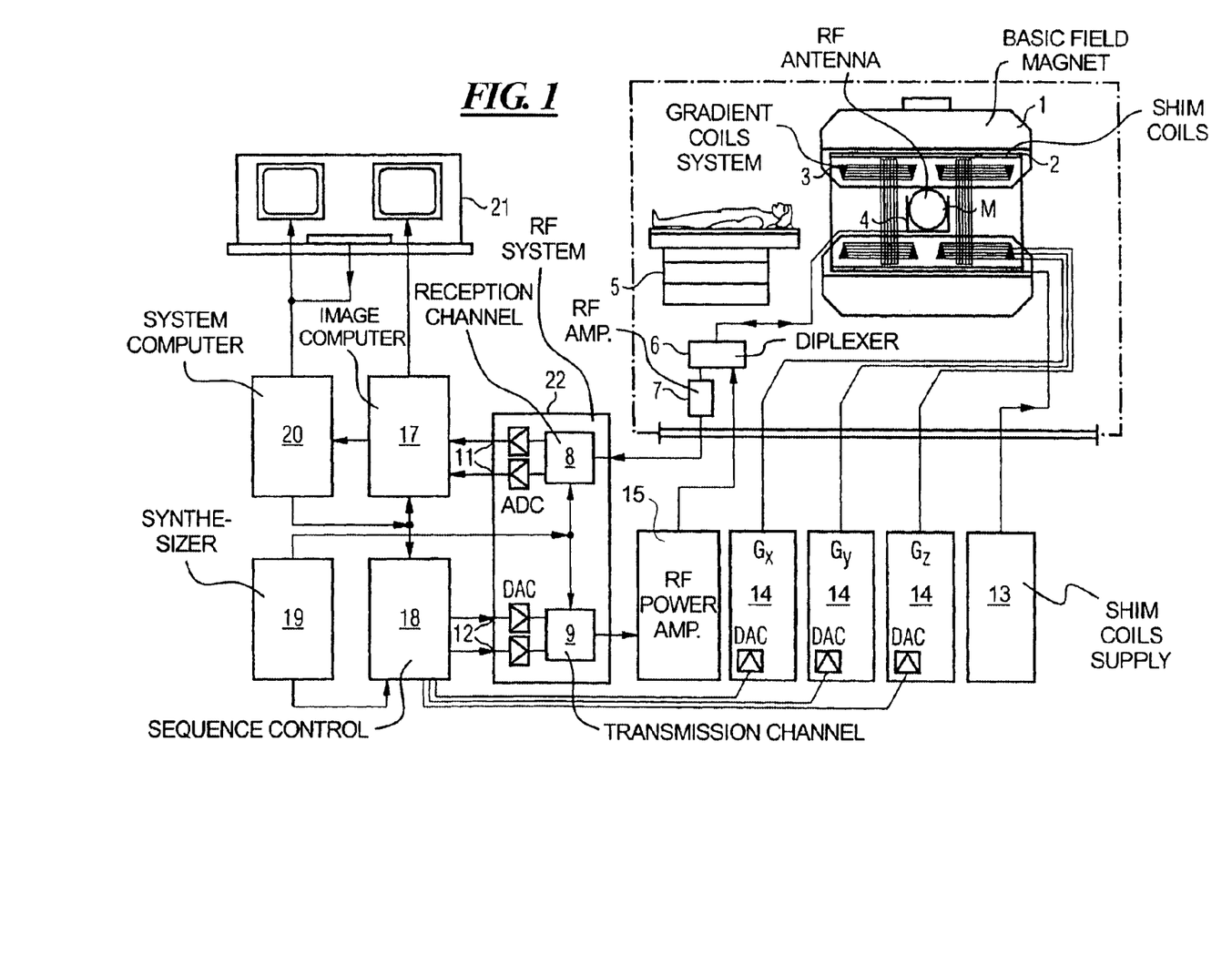
FIG. 1 is a schematic illustration of an MRT apparatus operable in accordance with the invention.

FIG. 1 schematically illustrates an MRT apparatus for the implantation of the present invention. The basic components of the MRT apparatus correspond to the known arrangement for MRT systems, with the differences discussed in detail below. A basic field magnet 1 generates a chronologically constant strong magnetic field for the polarization or alignment of the nuclear spin in the area under examination of an object, e.g. a part of a human body to be examined. The high degree of homogeneity of the basic magnetic field required for the magnetic resonance data acquisition is defined in a spherical measurement volume M, into which the part of the human body to be examined is inserted. For the support of the homogeneity requirements and in particular for the elimination of chronologically invariable influences, shim plates made of ferromagnetic material are attached at suitable locations. Chronologically variable factors are eliminated by shim coils 2, which are controlled by a shim power supply 15.

A cylindrical gradient system 3 formed by three coils is disposed in the basic field magnets 1. An amplifier 14 supplies each coil with power for the generation of a linear gradient field in the respective directions of the Cartesian coordinate system. The first coil of the gradient system 3 generates a gradient $G_x$ in the x direction, the second coil a gradient $G_y$ in the y direction, and the third coil a gradient $G_z$ in the z direction. Each amplifier 14 has an analog-to-digital converter, which is controlled by a sequence controller 18 for the correct chronological activation of the gradient impulses.

An RF antenna 4, which converts the signal pulse provided by an RF power amplifier 30 into a magnetic alternating field for the stimulation of the nuclei and the alignment of the nuclear spin of the object to be examined or the area of the object to be examined, is located within the gradient system 3. The RF antenna 4 also converts the alternating field emitted by the nuclear spins, i.e. generally the spin echoes brought about by a pulse sequence having one or more RF pulses and one or more gradient pulses, into a voltage that is fed to a high-frequency reception channel 8 of an RF system 22 via an amplifier 7. The RF system 22 has a transmission channel 9, in which the RF pulses for the stimulation of magnetic resonance are generated. The corresponding RF pulses are represented digitally as a pulse sequence determined by the system processor 20 in the sequence controller 18, as a series of complex numbers. This numerical series (sequence) is supplied as a real part and an imaginary part via inputs 12 to a digital-to-analog converter in the high-frequency system 22 and from this to the transmission channel 9. In the transmission channel 9, the pulse sequences are modulated up to an RF carrier signal, the base frequency of which corresponds to the resonant frequency of the nuclear spins in the measurement volume.

Switching between the transmission and reception modes takes place via a diplexer switch 6. The RF antenna 4 emits the RF pulse for the excitation of the nuclear spins into the measurement volume M and detects the resulting echo signals. The detected (received) magnetic resonance signals are demodulated in a phase-sensitive manner in the reception channel 8 of the RF system 22 and are converted via respective analog-to-digital converters for the real part and the imaginary part of the MR signal. An image is reconstructed by an image computer 17 from the data obtained in such a way. Management of the MR data, the image data, and the control programs take places via the system processor 20. The sequence controller 18 controls the generation of desired pulse sequences and the corresponding scanning of k-space, using a default with control programs. In particular, the sequence controller 18 controls the chronologically correct switching of the gradients, the emission of the RF pulses with a defined phase and amplitude as well as the receipt of the MR signals. The time base for the RF system 22 and the sequence controller 18 is made available by a synthesizer 19. The selection of suitable control programs for the generating of an MR image as well as the representation of the MR image takes place via a terminal 21, which has a keyboard as well as one or more monitors.

Figure 6A:
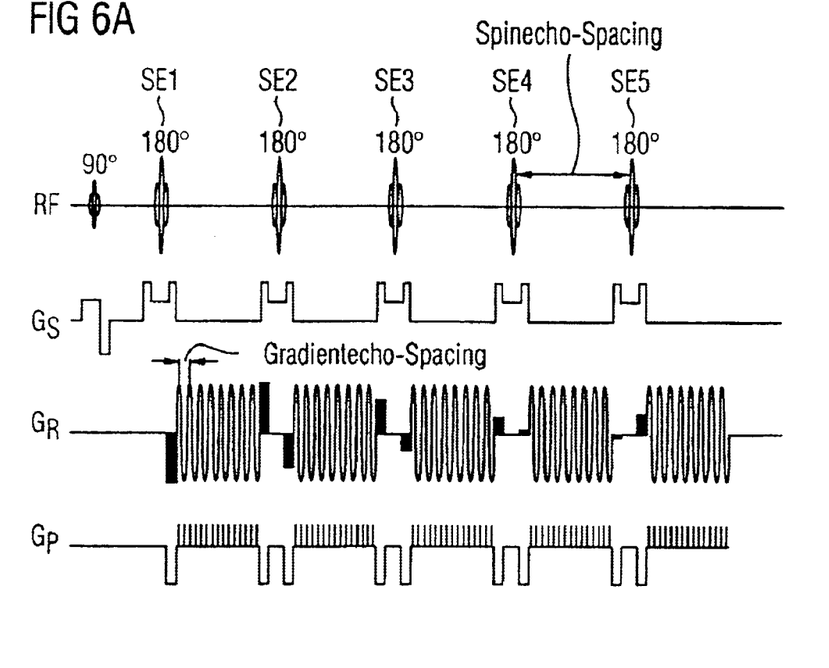
FIG. 6a schematically illustrates the SPURS sequence according to the invention, in which 16 gradient echoes per spin echo were acquired in this example.

The imaging sequence in accordance with the invention is generated in particular in the sequence controller 18 or in the system processor 20. The sequence diagram of the sequence in accordance with the invention is shown in FIG. 6a. An initial 90° excitation pulse is shown in the topmost line, followed by several 180° refocusing pulses. The 180° refocusing pulses have a defined uniform distance between the 90° excitation pulse and the first 180° refocusing pulse. In this manner, one spin echo can be generated in each of the areas (pauses) between the 180° refocusing pulses. The distance between two 180° refocusing pulses is called the "spin echo spacing." The slice readout gradient GS is activated for the selection of the slice during the 90° excitation pulse as well as during each 180° refocusing pulse. The main point of the sequence in accordance with the invention is to scan the corresponding spin echo between two 180° refocusing pulses (spin echo pulses) in the form of gradient echoes with a so-called readout gradient series (echo series). The readout gradient series is composed of several alternating e.g. trapezoidal or sinusoidal, component pulse series that are each activated in the area between two 180° refocusing pulses. A short phase encoding gradient GP (blip) is switched during each zero point of the corresponding alternating component pulse series. The combination of alternating readout gradients and blipped phase-coding gradients leads to the fact that only a relatively narrow section of the k-matrix is scanned per 180° refocusing pulse (spin echo pulse) with respect to the $k_x$ direction. In order to scan the entire k-matrix, a pre-phasing gradient that leads to a corresponding offset in the $k_x$ direction for each component pulse series is activated before each component pulse series. The surface integral of the readout gradient in the echo series determines the width of the scanned section of the k-matrix in the $k_x$ direction. The surface integral of the pre-phasing gradient defines the offset of the segment in the $k_x$ direction. In order to reset this $k_x$ offset before each subsequent component pulse series, the corresponding pre-phase gradient is inverted as a rephasing gradient, immediately after each component pulse series. Pre-phasing gradient as well as the rephasing gradient are shown in black in FIG. 6a.

Figure 6B:
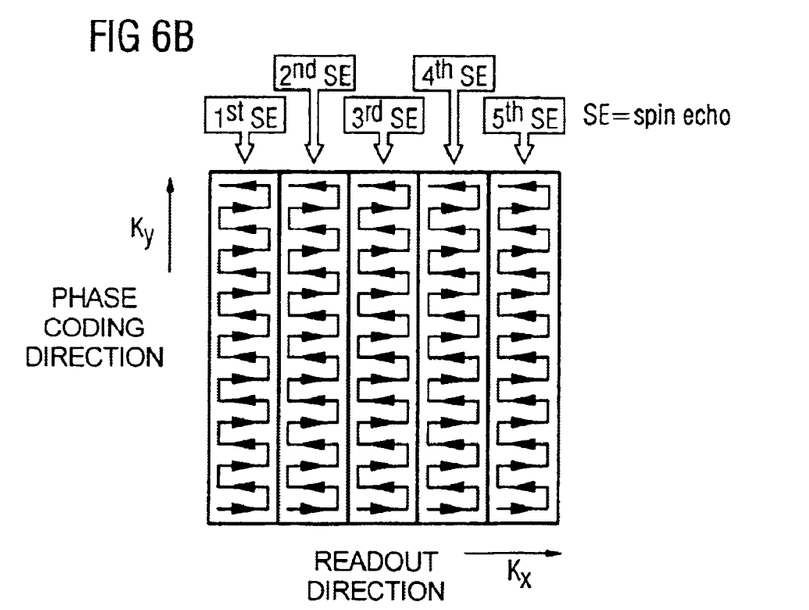
FIG. 6b illustrates the chronological progression of the k-matrix for the SPURS sequence in accordance with FIG. 6a, in which at total of five spin echoes are obtained.

The k-space trajectory or the scan behavior of this MRT imaging sequence in accordance with the invention is shown in FIG. 6b for the simplified case of five 180° refocusing pulses as well as sixteen readout gradient pulses per component pulse series (number of scan points in the $k_y$ direction). Such a component pulse series makes fifteen phase-coding gradients (blips) necessary. Each component pulse series in the readout direction scans a strip-like area of the k-matrix in the $k_y$ direction in combination with the blipped phase-coding gradient. The width of the strip in the $k_x$ direction is defined by the surface integral of the readout gradient. The integral of the pre-phase gradient defines the offset of the corresponding segment in the $k_x$ direction. The resolution in the $k_x$ direction within such a strip is determined by the sampling rate of the analog-to-digital converter (ADC) that is used. In as much, the scanning of such a strip can also be called an ADC event. The resolution within such a strip in the $k_y$ direction is defined by the number of half waves of a component pulse series. The (amplitude) spacing of two neighboring half waves with the same algebraic sign within a component pulse series is called "gradient echo spacing." The gradient echo spacing for a given half-wave number determines the length of the component pulse series and thus the area between two 180° refocusing pulses in which the corresponding spin echo is acquired in the form of several gradient echoes. The narrower the area, the more exactly—with respect to the dismantling of the transverse magnetization—the magnetic resonance signal is acquired.

In summary, the MRT imaging sequence in accordance with the invention is based on scanning the spin echo created by the 180° refocusing pulse during a given readout gradient pulse of a defined length (called component pulse series above) in the form of gradient echoes, with only part of the k-matrix being scanned. The scanning of the entire k-matrix takes place by a linking or stringing together of additional 180° refocusing pulses with the corresponding phase-coded (blipped) readout gradient pulses. The scanning of different x regions of matrix in the k-space (segmentation in the readout direction) makes the following sequence designation meaningful: "spatial encoding using readout segmentation." The acronym SPURS will be used below.

SPURS represents an equivalent alternative to known MRT imaging sequences but with significant advantages, in particular over the aforementioned fast MRT imaging procedures (TSE, RARE, HASTE, GRASE):

1. The number of required RF pulses (90° pulse with the ensuing 180° refocusing pulses) in SPURS is, with a consistent image quality, much lower than for procedures that have equivalent acquisition time. Thus, 128 RF pulses are required for a matrix size of 128×128 voxel in the RARE or HASTE radiographic techniques, approx. 25 for GRASE, and approx. 7 for SPURS. Fewer RF pulses results in the fact that slice-selective refocusing pulses can or may be used to a higher degree and thus no recognizable time delays occur between the absorption of several layers. Thus, the acquisition period for 20 slices takes a total of approx. 5 seconds compared to measurement with non-selective refocusing pulses, which takes more than a minute for the same number of slices (non-selective refocusing pulses lead to the fact that a break of several seconds is necessary between measurements of different slices for the regeneration of the magnetic resonance signal). Additionally, the low number of RF pulses in SPURS compared to RARE, HASTE, and GRASE results in a clearly reduced SAR, which means an advantage for body imaging, in particular with higher magnetic field strengths (for example, 3 Tesla), where SAR limitations represent a limiting factor. Furthermore, a low number of RF pulses has a particularly positive effect for diffusion-weighted imaging.

In diffusion-weighted imaging, de- and re-phasing gradients (as preparation gradients) are applied or switched before the start of the actual data acquisition. Even slight patient movement during the preparation period can cause phase changes in the signal and thus nullify the so-called CMPG (Carr Purcell Meiboom Gill) condition. This condition is fulfilled when the excitation pulse—in comparison to the subsequent refocusing pulses—has a 90° phase shift, but is no longer fulfilled when a non-reversible phase change occurs between RF excitation and the first refocusing pulse. A non-reversible phase change is a phase change that cannot be reversed by the refocusing pulse (echo-like) (e.g. a phase change induced by movement occurring in diffusion sequences). A reversible phase change is e.g. a phase evolution caused by resonance offset. A violation of the CPMG condition and resulting artifacts occur less often the fewer RF or refocusing pulses are used.

2. SPURS requires a high gradient switching rate (slew rate) with a comparably low gradient amplitude (due to the narrow scan area in the readout direction). This means that SPURS is particularly suitable for use in whole-body gradient coils, since normally the total theoretical efficiency of whole-body coils cannot be completely used due to the normally required high gradient amplitudes that reduce the stimulation limits.

3. Since each readout gradient pulse series only serves to scan a portion in the $k_x$ direction, only a relatively low gradient moment is required, so a correspondingly short gradient echo spacing is enabled. A short gradient echo spacing, however, causes a readout of the resonant signal preferably in the middle area of the respective refocusing pulse, which is why an accumulation of disturbance phases is avoided based on magnet field susceptibilities and the occurrence of susceptibility artifacts is prevented. Furthermore, a short gradient echo spacing causes the lower sensitivity of the SPURS imaging sequence compared to dynamic magnet field discontinuities that are caused, for example, by eddy currents.

4. In comparison to GRASE, in which a complex signal modulation occurs in the $k_y$ direction due to $T_2$ relaxation, $T_2^*$ relaxation, as well as an off-resonant phase development, data acquisition of all $k_y$ scan points for a corresponding spin echo per SPURS leads to a smoother version of the raw data signals in k-space. For this reason, ghost and ring artifacts are avoided with SPURS in contrast to GRASE.

5. All central k-space points are acquired with the same spin echo, which leads to a better contrast behavior (compared to a multi-shot TSE sequence).

It is further noted that SPURS can be combined advantageously with other MRT-imaging procedures, for example with a) the partial Fourier acquisition technique (P.Margosian, Abstract in proc. SMRM, p. 1024, 1985), in which data from one or more $k_x$ segments are only acquired on one k-space half, b) a standard-partial parallel imaging technique (e.g. SMASH D. Sodickson Magn. Reson. Med. 38, p. 591–603, 1997—SENSE K. Pruessman, Magn. Reson. Med. 42, p. 952–962, 1999 or GRAPPA M. Griswold, Magn. Reson. Med. 47, p. 1202–1210, 2002) in order to reduce the number of measured $k_y$ scan points (and thus the spin echo spacing) using several RF receive coils, and with c) a magnetization preparation using RF pulses and magnetic field gradient pulses for improvement of the image contrast (examples: diffusion weighting, fluid suppression).

In a preferred version of the procedure in accordance with the invention, only a part of the k-matrix is scanned in the $k_x$ or $k_y$ direction after a high-frequency excitation pulse, and the scanning of the entire k-matrix is achieved by the progression of several RF excitation pulses. A procedure modified in this manner represents a multi-shot technique, analogous to the manner in which a single-shot RARE sequence is modified to a turbo-spin-echo sequence (TSE sequence).

In another preferred version of the procedure in accordance with the invention, the procedure is used in combination with phase coding in the slice-selection direction using slice-selective or non-slice-selective excitation pulses for 3D imaging.

Although modifications and changes may be suggested by those skilled in the art, it is the intention of the inventor to embody within the patent warranted hereon all changes and modifications as reasonably and properly come within the scope of his contribution to the art.

What is claimed is:

1. A method for magnetic resonance imaging comprising the steps of:
   (a) emitting a radio-frequency excitation pulse for exciting nuclear spins in an object, the excited nuclear spins causing magnetic resonance signals to be emitted;
   (b) selecting a slice in said object in which said nuclear spins are excited by simultaneously activating a slice selection gradient during emission of said radio-frequency excitation pulse;
   (c) activating a pulse series comprising a plurality of refocusing pulses;
   (d) during each refocusing pulse, activating a slice selection gradient pulse; and
   (e) activating alternating readout gradient pulse series respectively between successive ones of said refocusing pulses, and activating a dephasing pulse immediately before each readout gradient pulse series and activating a re-phasing pulse immediately after readout gradient pulse series for producing an offset in a readout direction for causing each readout gradient pulse series to scan a portion of k-space in a $k_x$ direction in a serpentine-like path, said serpentine-like path in each part of k-space being produced by activating short phase-coding gradient pulses during each zero point of the associated readout gradient pulse series.

2. A method as claimed in claim 1 comprising employing a 90° pulse as said RF excitation pulse.

3. A method as claimed in claim 1 comprising employing 180° pulses respectively as said refocusing pulses.

4. A method as claimed in claim 1 comprising equidistantly spacing the respective refocusing pulses from each other.

5. A method as claimed in claim 1 wherein each readout gradient pulse series has a gradient moment associated therewith that is sufficiently small for producing short gradient echo spacing for producing insensitivity to magnetic field susceptibilities and dynamic magnetic field discontinuities.

6. A method as claimed in claim 1 comprising combining steps (a), (b), (c), (d) and (e) with a partial Fourier acquisition technique.

7. A method as claimed in claim 1 comprising combining steps (a), (b), (c), (d) and (e) with a partial parallel imaging technique.

8. A method as claimed in claim 7 comprising selecting said partial parallel imaging technique from the group consisting of SMASH, SENSE and GRAPPA.

9. A method as claimed in claim 1 comprising implementing magnetization preparation using RF pulses and magnetic field gradient pulses for at least one of diffusion weighting and fluid suppression.

10. A method as claimed in claim 1 comprising, after said radio-frequency excitation pulse in step (a), scanning only said part of k-space, and scanning an entirety of k-space by repeating step (a).

11. A method as claimed in claim 1 comprising phase coding said magnetic resonance signals in a slice-selection direction using slice-selective excitation pulses for 3D imaging.

12. A method as claimed in claim 1 comprising phase coding said magnetic resonance signals in a slice-selection direction using non-slice-selective excitation pulses for 3D imaging.

13. A magnetic resonance tomography apparatus comprising:
   a sequence controller;
   a) emitting a radio-frequency excitation pulse for exciting nuclear spins in an object, the excited nuclear spins causing magnetic resonance signals to be emitted, and for receiving said magnetic resonance signals;
   a gradient system for simultaneously activating a slice selection gradient during emission of said radio-frequency excitation pulse for selecting a slice in said object in which said nuclear spins are excited;
   said sequence controller activating a pulse series from said RF antenna comprising a plurality of refocusing pulses and during each refocusing pulse, activating a slice selection gradient pulse from said gradient system; and
   said sequence controller activating alternating readout gradient pulse series from said gradient system respectively between successive ones of said refocusing pulses, and activating a dephasing pulse from said gradient system immediately before each readout gradient pulse series and activating a re-phasing pulse from said gradient system immediately after readout gradient pulse series for producing an offset in a readout direction for causing each readout gradient pulse series to scan a portion of k-space in a $k_x$ direction in a serpentine-like path, said serpentine-like path in each part of k-space being produced by activating short phase-coding gradient pulses during each zero point of the associated readout gradient pulse series.

* * * * *